(12) United States Patent
Zhu et al.

(10) Patent No.: US 6,734,709 B1
(45) Date of Patent: May 11, 2004

(54) METHOD AND SYSTEM FOR PERFORMING SAMPLING ON THE FLY USING MINIMUM CYCLE DELAY SYNCHRONIZATION

(75) Inventors: Zhubiao Zhu, Fort Collins, CO (US); Kenneth Koch, II, Fort Collins, CO (US); J Robert Sims, III, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/383,127

(22) Filed: Mar. 6, 2003

(51) Int. Cl.[7] .......................... H03K 3/017; H03K 5/04; H03K 7/08
(52) U.S. Cl. ...................................... 327/171; 327/142
(58) Field of Search ................................. 327/142, 171, 327/291

(56) References Cited

U.S. PATENT DOCUMENTS 5,878,250 A * 3/1999 LeBlanc ................. 713/600

* cited by examiner

*Primary Examiner*—Terry D. Cunningham
*Assistant Examiner*—Quan Tra

(57) ABSTRACT

A method and system for sampling on the fly one or more integrated circuit nodes coupled to one or more bus domain clocks of an integrated circuit using minimal clock cycle delay synchronization. Sample on the fly circuitry, set-reset circuitry and metastable rejection circuitry are used to provide a sufficient pulse width for sampling on the fly the one or more nodes when the one or more bus domain clocks require asynchronous operation. The sample on the fly circuitry is also operable to synchronously sample on the fly the one or more nodes.

26 Claims, 5 Drawing Sheets

METHOD AND SYSTEM FOR PERFORMING SAMPLING ON THE FLY USING MINIMUM CYCLE DELAY SYNCHRONIZATION

TECHNICAL FIELD

This invention relates generally to the field of integrated circuit devices, and more specifically to sampling of multiple nodes within an integrated circuit.

BACKGROUND OF THE INVENTION

Sampling on the fly (SOF) is a technique used to sample a large number of nodes with scan latches and then scan out the data before the scan latches are updated. This technique may be applied, for example, to sample multiple nodes of a processor architecture during the test and debug phase of the processor development cycle. In such an example, SOF may be used to non-invasively evaluate the performance of the integrated circuit by taking snapshots of bus and module values at various points of operation. One important aspect of sample on the fly is the timing related to the scan operation. If N nodes are to be scanned, then ideally the N nodes would be scanned in the same clock cycle. Moreover, if an integrated circuit supports synchronous and asynchronous operation, then sampling N nodes during a minimum number of clock cycles is a difficult task.

SUMMARY

According to a system of the present invention, a SOF circuit for sample on the fly synchronization of multiple nodes of an integrated circuit with minimal clock cycle delay is disclosed. The integrated circuit may contain several circuits where each circuit has multiple bus clocks and multiple bus clock domains. The SOF circuit, which may operate synchronous or a synchronously, is coupled to the circuits and generates an UPDATE signal that can latch the multiple nodes of the integrated circuit. The value of the UPDATE signal is controlled by a setreset flip-flop circuit. The set-reset flip-flop circuit sets or resets the value of the UPDATE signal so that correct latching of the multiple nodes occurs. The synchronous and asynchronous nature of the multiple bus clocks is addressed by a metastable rejection circuit. The metastable rejection circuit ensures that all nodes can be latched when the UPDATE signal is received by the SOF circuit. In accordance with a method of the present invention, the SOF circuit receives a read signal that enables the latching of the multiple nodes. The flip-flop circuit generates a sample signal after the flip-flop circuit receives a set signal from the multiple bus clocks. The SOF circuit receives the sample signal from the flip-flop circuit, and the sample signal is able to latch onto a clock of the multiple bus domain clocks. The read signal is combined with the latched sample signal to generate the UPDATE signal. In an asynchronous system, the set signal may come in a metastable problem time period. In that case, an insufficient pulse width UPDATE signal goes through the metastable rejection circuit. The metastable rejection circuit ensures that the UPDATE signal has a sufficient pulse width to latch the multiple nodes.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
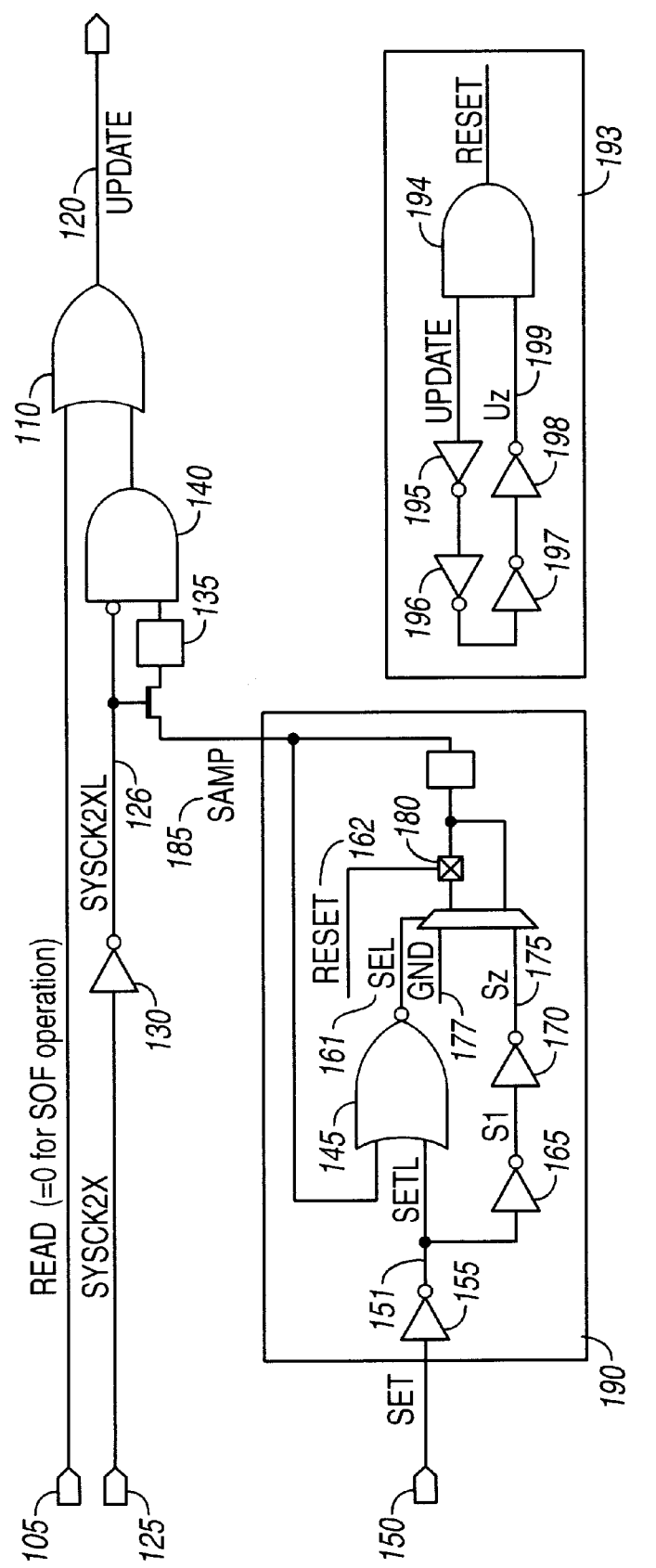
FIG. 1 is a circuit diagram of a sample on the fly circuit, according to a certain embodiment of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Referring now to FIG. 1 a circuit diagram of a cross-clock domain sample on the fly circuit 100 is shown, according to a certain embodiment of the present invention. A READ signal 105 is received from a core clock domain circuit. The READ signal 105 is operable to enable the scan of one or more latches corresponding to one or more nodes of an integrated circuit. The scanning of the one or more nodes is controlled by the value of UPDATE signal 120. In a certain embodiment of the present invention, the scanning of the one or more nodes occurs when UPDATE signal 120 is 1. A positive pulse on the SET signal 150 sent from the core clock domain circuit will make a positive pulse at UPDATE 120. Note that UPDATE signal 120 is in a bus clock domain and used to latch scan nodes of bus clock domain circuits. In an asynchronous and synchronous system with a particular clock ratio, if the SET signal 150 has a small time period in which a metastable state occurs so that a pulse width of UPDATE signal 120 is not enough for a sample on the fly requirement, then sample on the fly circuit 100 has a mechanism to detect the metastable state. In the metastable state, sample on the fly circuit 100 does not reset muxing latch 180. UPDATE signal 120 is generated in a later clock cycle.

Figure 2:
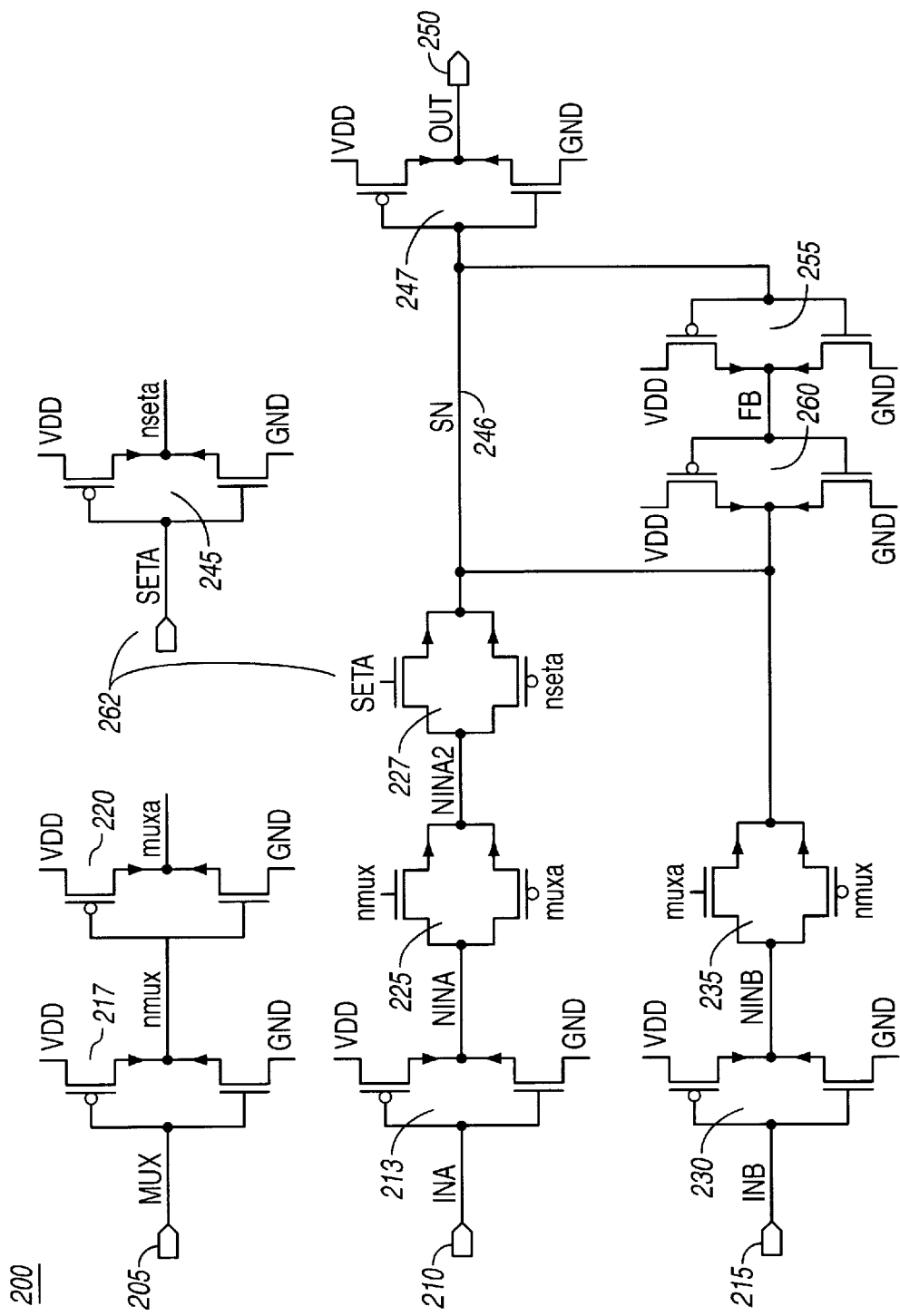
FIG. 2 is a circuit diagram of a multiplexing circuit of a flip-flop used in FIG. 1, according to a certain embodiment of the present invention.

Referring now to FIG. 2 a circuit diagram of a multiplexing circuit 200 of flip-flop 190 of the sample on the fly circuit 100 used in FIG. 1, according to a certain embodiment of the present invention. A logic 1 at MUX signal 205 makes the circuit select INB 215 to go through fet 230, pass-fet 235, fet 260, fet 265 and thus put INA 210 at OUT 250. Note that the MUX signal 205 is present at pass-fet 225 and pass-fet 235 by the use of nmux 217 and muxa 220. A Logic 0 at MUX signal 205 makes the circuit 200 choose INA 210 to go through pass-fet 213 and to the input of pass-fet 227. If SETA 262 is logic 1, then the MUX signal 205 goes to storage node SN 246, and OUT 250 of fet 247. SETA 262 is coupled to SN 246 via fet 245 and pass-fet 227. Note that SETA 262 signal's logic 1 needs to satisfy a minimum width requirement for the pass-fet 227 to pass a value to OUT 250. As a sub-circuit of the sample on the fly circuit 100, the INA 210 connects to GND (ground) 177, the INB connects to Sz 175, the OUT 250 connects to SAMP 185, the SETA 262 connects to RESET 162, the MUX 205 connects to SEL 161.

Figure 3:
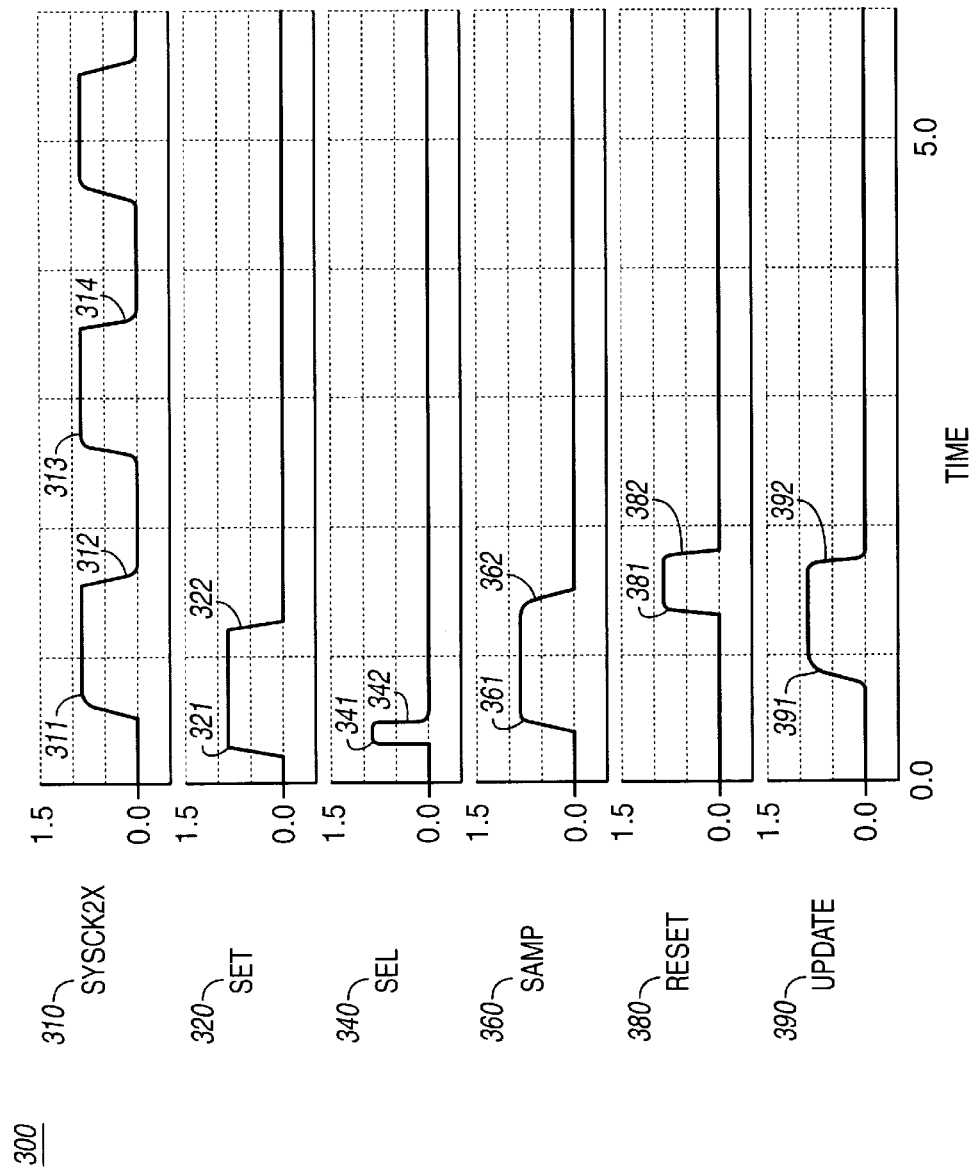
FIG. 3 shows a simulation result of a zero-clock cycle delay operation of the sample on the fly circuit, according to a certain embodiment of the present invention.

Referring now to FIG. 3 a simulation result 300 of a zero-clock cycle delay operation of the sample on the fly circuit, according to a certain embodiment of the present invention. It is noted that in certain embodiments of the present invention, an amount of clock cycle delay may be a minimum, non-zero value. The result of FIG. 3 shows a non-metastable operation of the circuit. A rising edge of the SET 321 causes the SEL 161 to go logic 1 341 because SEL 161 is the output of the NOR 145 which has two inputs SAMP 185 with logic 0 and SETL 151 with logic goes to 0. The SEL 161 with logic 1 selects Sz 175 as the muxing latch 180 input. At that time, because of delay line 155, delay line 165, delay line 170, the Sz 175 is still with logic 1. So the logic 1 goes to muxing latch 180 and the output of the muxing latch SAMP 185 goes to logic 1 361. At this point a rising edge of SET signal 150 is latched.

In a certain embodiment of the present invention, the latched logic 1 at SAMP 185 will be latched to a storage node of the latch 135 at the logic 1 phase of SYSCK2XL 126 (or logic 0 phase of SYSCK2X 125). The latched logic 1 at latch 135 AND ed with inverted SYSCK2XL produces logic 1 of UPDATE 120, which is shown as waveform 390.

The latched logic 1 at SAMP 185 goes to device NOR 145 causes SEL 161 to go to logic 0 which causes the muxing latch to select GND 177 as input. Full-width UPDATE 120 (waveform 390) goes to delay line 195, delay line 196, delay line 197, delay line 198 and device AND 194 to produce RESET 162 (waveform 380) with enough width to reset the muxing latch 180, thus SAMP 185 goes to 0 (waveform 362). This completes a sample on the fly operation and the sample on the fly circuit 100 is ready for a next sample on the fly operation.

Figure 4:
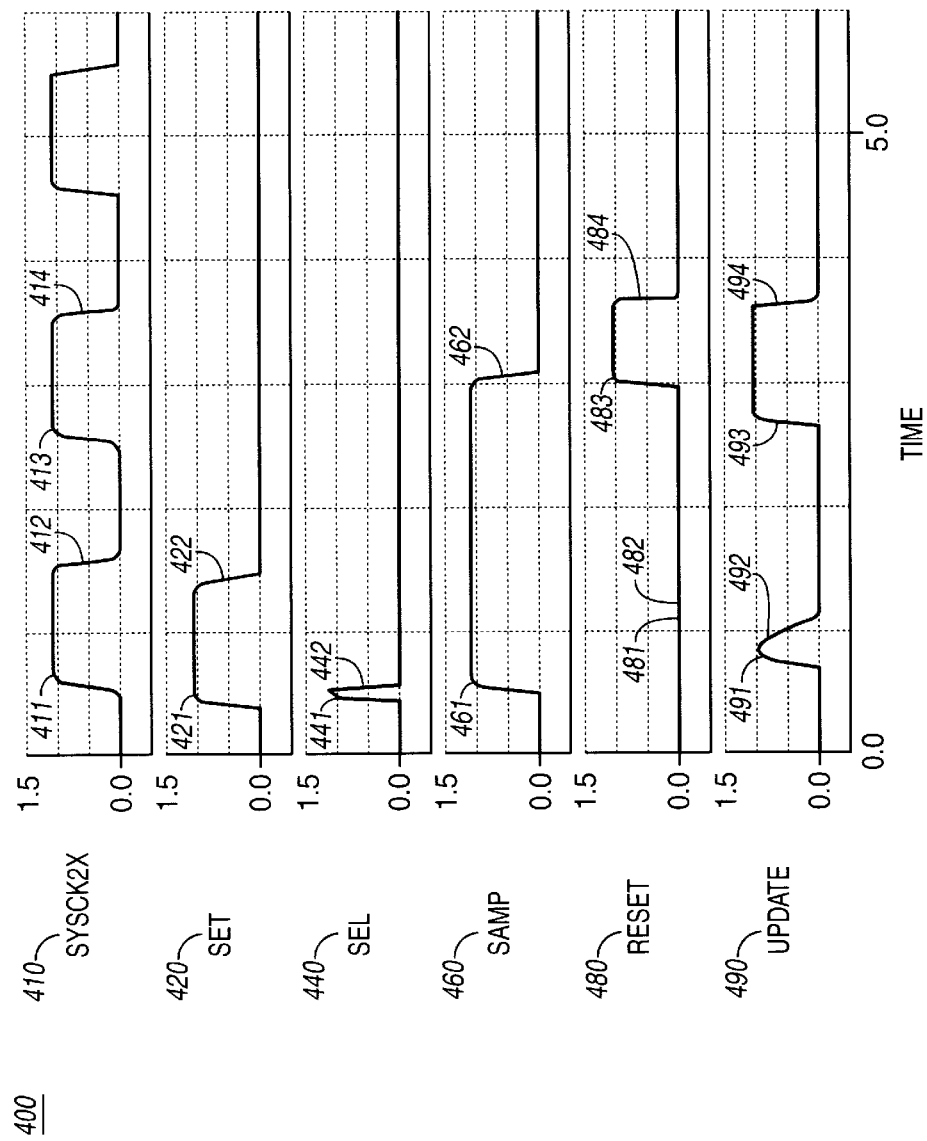
FIG. 4 shows a simulation result of the metastable affect and how the sample on the fly circuit deals with it, according to a certain embodiment of the present invention.

In an asynchronous system (asynchronous with respect to a bus clock and core clock) and some synchronous system with particular core clock and bus clock ratios, SET signal 150 could arrive at a particular time which causes a metastable state. Referring now to FIG. 4 a simulation result of the metastable effect and how the sample on the fly circuit 100 deals with it is shown, according to a certain embodiment of the present invention. FIG. 4 shows the circuit 100 working in a metastable state. The SET signal 150 rising edge comes very close to the rising edge of the SYSCK2X 411. This causes the rising edge of the SAMP 461 to occur late enough to violate latch 135 setup time, thereby causing the metastable effect. The metastable effect causes a narrow peak 491, 492. This narrow peak may be not good enough to correctly latch all scan nodes of the one or more scan nodes. In order to address the metastable problem, UPDATE 120 is logically ANDed with a delayed version of UPDATE, Uz 199, to produce a narrower RESET 162 logic 1 peak or no peak if the UPDATE peak is too narrow.

The circuit 100 selects an appropriate delay for these delay devices, 195, 196, 197, 198 so that all transitions are caught. In a certain embodiment of the present invention, the amount of delay is given by:

$$\text{delay} = \text{Width.UPDATE.minimum} - \text{Width.RESET.minimum}$$

Here the Width.UPDATE.minimum is the minimum width of the UPDATE signal 120 that is required for latching all scan nodes correctly. Width.RESET.minimum is the minimum width of RESET signal 162 required for correct resetting operation of the muxing latch 180.

In the case of the simulation, the RESET signal 162 logic 1 peak does not appear at position 481, 482. This narrow or no peak at point 481 and point 482 does not reset the muxing latch so the SAMP 460 keeps logic 1 until a next successful latching by latch 135. After the successful latching by latch 135, the full-width UPDATE 120 (waveform 493, 494) goes to a delay line 195, delay line 196, delay line 197, delay line 198 and a device AND 194 to produces RESET 162 (waveform 483, 484) with enough width to reset the muxing latch 180. Thus SAMP 185 goes to 0 (waveform 462). This completes a sample on the fly operation.

A Bus frequency is half of SYSCK2X clock frequency. In a certain embodiment of the present invention, bus domain sample on the fly nodes include the bus clock node. So a bus clock phase can be detected. The bus clock phase info tells in which SYSCK2X clock cycle sample on the fly is performed.

Figure 5:
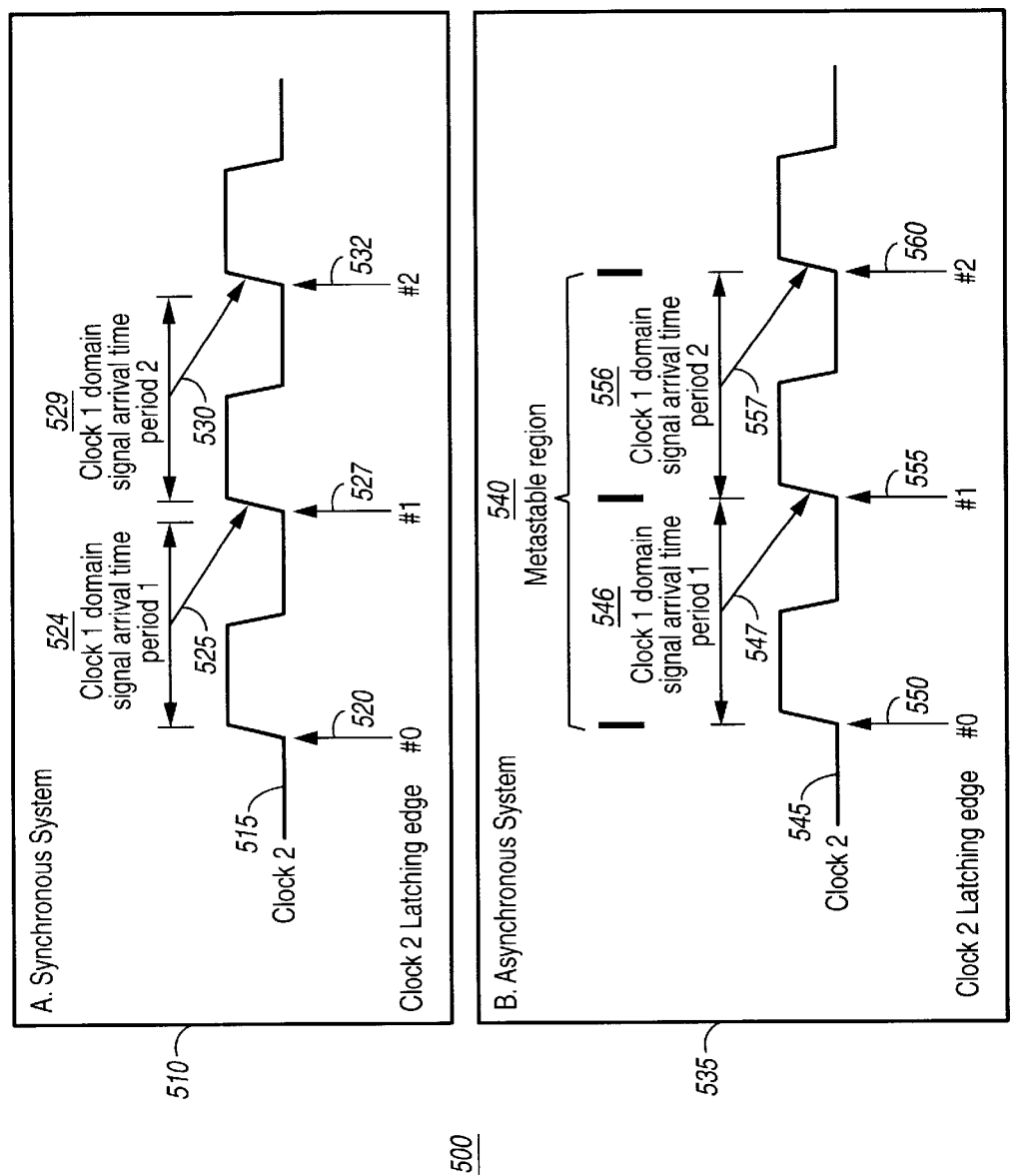
FIG. 5 is a timing diagram showing a two-clock relative timing for synchronous system (A) and asynchronous (B) systems with zero cycle delay synchronization, according to a certain embodiment of the present invention.

Referring now to FIG. 5 a timing diagram 500 showing a two-clock relative timing for a synchronous system A 510 and asynchronous system B 535 with zero cycle delay synchronization is shown, according to a certain embodiment of the present invention. Synchronous system A 510 is represented by a timing diagram without a metastable problem. A clock 1 domain signal arrival time periods (524, 529) and their associated latching edges (525, 530) are shown. A clock 2 515 waveform is also shown with latching edges (520, 527, 532). A signal that arrives during period 524 will be latched by clock 2's latching edge 527 and a signal that arrives during period 529 will be latched by clock 2's latching edge 532. Note that there is a timing gap between valid signal arrival time periods 524, 529.

Asynchronous system B 535 is represented by a timing diagram with a metastable problem. A clock 1 domain signal is shown with clock 1 domain signal arrival time periods (546, 556) and their associated latching edges (547, 557). Note that there is no time gap between clock 1 domain signal arrival time periods 546 and 556. Clock 1 domain signal produces metastable regions 540 shown by vertical bars in the diagram. It should be noted that in a certain embodiment of the present invention, circuit 100 does not change a clock latching timing relationship between a clock 1 domain signal arrival time and an associated clock 2 latching edge. When circuit 100 is used in synchronous operation, it behaves like a synchronous circuit. According to a certain embodiment of the present invention, asynchronous system B 535 is an extension of synchronous system A 510 without altering a timing relationship between clock 1 domain signal arrival time and a latching edge of clock 2, wherein circuit 100 is operable to have a timing relationship substantially equivalent to one or more of synchronous system A 510 and asynchronous system B 535.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A system operable to sample on the fly synchronously or asynchronously using minimal clock cycle delay synchronization one or more nodes of an integrated circuit that are coupled to one or more bus domain clocks, comprising:
   circuitry comprising one or more bus clocks of the one or more bus clock domains;
   a sample on the fly (SOF) circuit coupled to the one or more nodes, said SOF circuit operable to produce an UPDATE signal to latch the one or more nodes;
   a set-reset (S-R) circuit coupled to the SOF circuit operable to perform a set and reset of the UPDATE signal; and
   a metastable rejection circuit coupled to the SOF circuit and coupled to the S-R circuit, said metastable rejection circuit operable to ensure latching of all nodes when a sample on the fly UPDATE signal is received.

2. The system of claim 1, wherein the one or more bus domain clocks are produced by a clock with a frequency double that of a bus clock and substantially equivalent to a data clock.

3. The system of claim 1, wherein the one or more bus domain clocks are related to a core domain clock by one or more ratios.

4. The system of claim 1, wherein the S-R circuit is a flip-flop circuit, further comprising:
   a SET input signal coupled to the S-R flip-flop circuit;
   an OR gate coupled to the SET signal and coupled to an output SAMP signal of the S-R circuit;
   a multiplexer coupled to the SET signal, coupled to a ground signal, and coupled to an output of the OR gate; and
   a storage element coupled to the SOF circuit operable to generate the output SAMP signal, wherein said storage element is coupled an output of the multiplexer and further coupled to a RESET signal.

5. The system of claim 4, wherein the set signal is delayed prior to being coupled to the OR gate and further delayed prior to being coupled to the multiplexer.

6. The system of claim 4, wherein the value of the flip-flop is set by a rising edge of the SET signal.

7. The system of claim 6, wherein a RESET value of 1 will reset the value of the flip-flop unless the rising edge of the SET signal is occurring.

8. The system of claim 4, wherein the storage device is a single storage device.

9. The system of claim 4, wherein the RESET signal is provided by an output of the metastable rejection circuit.

10. The system of claim 1, wherein the SOF circuit further comprises:
    a READ input coupled to a second OR gate, said second OR gate operable to generate the UPDATE signal;
    an AND gate coupled to the clock signal; and
    a SAMP signal from the S-R circuit coupled to the AND gate, wherein said AND gate is coupled to the second OR gate.

11. The system of claim 10, wherein the SAMP signal is latched by an inversion of a falling edge of the clock.

12. The system of claim 10, wherein a frequency of the clock signal is twice a frequency of a bus clock frequency of a bus clock of the one or more bus domain clocks.

13. The system of claim 10, wherein the metastable rejection circuit further comprises:
    the UPDATE signal coupled to the AND gate;
    the UPDATE signal delayed by one or more samples, wherein the delayed UPDATE signal is coupled to the AND gate; and
    the AND gate producing the RESET signal, wherein the RESET signal is coupled to the flip-flop circuit.

14. The system of claim 1, wherein a node of the one or more nodes is a bus clock node, thereby enabling a bus clock phase to be detected.

15. A method for sampling on the fly synchronously or asynchronously using minimal clock cycle delay synchronization one or more nodes of an integrated circuit, wherein the one or more nodes are coupled to one or more bus domain clocks of the integrated circuit, comprising:
    a sample on the fly (SOF) circuit receiving a READ signal;
    a flip-flop circuit generating a SAMP signal upon the flip-flop circuit receiving a SET signal from a core clock domain of the one or more bus domain clocks;
    the SOF circuit receiving the SAMP signal from the flip-flop circuit, wherein the SAMP signal is operable to latch onto a clock of the one or more bus domain clocks;
    combining the READ signal with the latched SAMP signal to generate an UPDATE signal; and
    a metastable rejection circuit ensuring that the UPDATE signal has a sufficient pulse width to latch the one or more nodes.

16. The method of claim 15, wherein a node of the one or more nodes is a bus clock node that enables a bus clock phase to be detected.

17. The method of claim 15, wherein a frequency of the clock is two times a frequency of a bus domain clock of the one or more bus domain clocks.

18. The method of claim 15, wherein the SAMP signal is generated using a flip-flop circuit comprising a SET signal coupled to the flip-flop, wherein the SET signal is asynchronous with respect to the clock and the SAMP signal is an output of the flip-flop.

19. The method of claim 18, wherein upon receiving the SET signal, the SAMP signal is set to 1.

20. The method of claim 18, wherein the SAMP signal is latched onto a storage node during logic 0 phase of the clock and further comprising combining the latched signal with the inverted clock in an AND gate to generate the UPDATE signal.

21. The method of claim 20, wherein after the UPDATE signal is generated resetting the flip-flop circuit.

22. The method of claim 18, wherein the flip-flop circuit generating the SAMP circuit further comprises:

a rising edge of SET triggering the flip-flop;

a RESET value of 1 resetting the flip-flop; and a RESET value of 0 allowing the value of the SET signal to be stored in a signal storage node.

23. The method of claim 15, wherein the metastable rejection circuit generating the RESET value further comprises:

driving an AND gate with the UPDATE signal and a delayed value of the UPDATE signal;

determining an amount of delay so that all nodes of the one or more nodes are sampled; and using the output of the AND gate to generate the RESET signal.

24. The method of claim 23, wherein the pulse width of the UPDATE signal is the pulse width of the RESET signal plus the amount of delay.

25. The method of claim 15, wherein under asynchronous operation, a timing of a latching clock edge to a timing of a sending clock edge is substantially equivalent to a timing of a synchronous operation between first and second bus domain clocks.

26. A system operable to sample on the fly synchronously or asynchronously using minimal clock cycle delay synchronization one or more nodes of an integrated circuit that are coupled to one or more bus domain clocks, comprising:

circuitry comprising one or more bus clocks of one or more bus clock domains;

a sample on the fly (SOF) circuit coupled to the one or more nodes;

a set-reset (S-R) circuit coupled to the SOF circuit; and means coupled to the SOF circuit and the S-R circuit for latching the one or more nodes during a metastable condition when a sample on the fly UPDATE signal is received by the SOF circuit.

* * * * *